United States Patent
Nakahara

(10) Patent No.: US 8,049,235 B2
(45) Date of Patent: Nov. 1, 2011

(54) NITRIDE SEMICONDUCTOR LIGHT EMITTING ELEMENT WITH BRAGG REFLECTION LAYERS AND ANTI-REFLECTION LAYERS TO IMPROVE LIGHT EXTRACTION EFFICIENCY

(75) Inventor: Ken Nakahara, Kyoto (JP)

(73) Assignee: Rohm Co., Ltd. (JP)

( * ) Notice: Subject to any disclaimer, the term of this patent is extended or adjusted under 35 U.S.C. 154(b) by 449 days.

(21) Appl. No.: 12/223,172

(22) PCT Filed: Jan. 23, 2007

(86) PCT No.: PCT/JP2007/050968
§ 371 (c)(1),
(2), (4) Date: Jul. 24, 2008

(87) PCT Pub. No.: WO2007/086366
PCT Pub. Date: Aug. 2, 2007

(65) Prior Publication Data
US 2010/0224892 A1 Sep. 9, 2010

(30) Foreign Application Priority Data
Jan. 24, 2006 (JP) .................. 2006-015259

(51) Int. Cl.
*H01L 33/10* (2010.01)
*H01L 27/15* (2006.01)

(52) U.S. Cl. ...... 257/98; 257/79; 257/103; 257/E33.068

(58) Field of Classification Search ...... 257/98
See application file for complete search history.

(56) References Cited

U.S. PATENT DOCUMENTS

| 5,862,167 A | * | 1/1999 | Sassa et al. | 372/45.01 |
| 6,002,700 A | * | 12/1999 | Sato | 372/45.01 |
| 2005/0064710 A1 | * | 3/2005 | Chidambarrao et al. | 438/689 |
| 2005/0082545 A1 | * | 4/2005 | Wierer et al. | 257/79 |

FOREIGN PATENT DOCUMENTS
JP 04-105382 4/1992
(Continued)

OTHER PUBLICATIONS
Meyer-Arendt, Introduction to Classical and Modern Optics, pp. 215-216 and 263, Englewood Cliffs, NJ: Prentice Hall, 1995.*

Primary Examiner — Ha Tran T Nguyen
Assistant Examiner — Raj R Gupta
(74) Attorney, Agent, or Firm — Rabin & Berdo, PC

(57) ABSTRACT

Provided is a nitride semiconductor light emitting element that has improved light extraction efficiency and a wide irradiation angle of outgoing light irrespective of the reflectance of a metal used for an electrode. An n side anti-reflection layer 2 and a p side Bragg reflection layer 4 are formed so as to sandwich an MQW active layer 3 that serves as a light emitting region, and the nitride semiconductor light emitting element has a double hetero structure. On top of the n side anti-reflection layer 2, an n electrode 1 is formed. Meanwhile, at the lower side of the p side Bragg reflection layer 4, a p electrode 5, a reflection film 7, and a pad electrode 8 are formed, and the pad electrode is bonded to a support substrate 10 with a conductive bonding layer 9 interposed in between. Both the n side anti-reflection layer 2 and the p side Bragg reflection layer 4 also serve as contact layers. The n side anti-reflection layer 2 is disposed on the light-extracting-direction side while the p side Bragg reflection layer 4 is disposed on the opposite side to the light-extracting-direction side. Consequently, the light extraction efficiency is improved.

3 Claims, 3 Drawing Sheets

FOREIGN PATENT DOCUMENTS

| JP | 8-032116 | 2/1996 |
| JP | 10-074979 | 3/1998 |
| JP | 2002-111057 | 4/2002 |
| JP | 2003-332618 | 11/2003 |
| JP | 2004-087815 | 3/2004 |
| JP | 2004-119756 | 4/2004 |

* cited by examiner

NITRIDE SEMICONDUCTOR LIGHT EMITTING ELEMENT WITH BRAGG REFLECTION LAYERS AND ANTI-REFLECTION LAYERS TO IMPROVE LIGHT EXTRACTION EFFICIENCY

TECHNICAL FIELD

The present invention relates to a nitride semiconductor light emitting element that has improved light extraction efficiency.

BACKGROUND ART

Nitride semiconductors are used for: for example, blue LEDs, which are used as light sources of illumination, backlights, or the like; multi-color LEDs; LDs; and the like. Bulk single crystals for the nitride semiconductors, however, are difficult to be manufactured. Instead, GaN is grown on a substrate for growth, such as a sapphire substrate and a SiC substrate, by the MOCVD (metal organic chemical vapor deposition) method.

Above all, sapphire substrates, which exhibit an excellent stability in the high-temperature ammonia atmosphere of the epitaxial growth process, are particularly used as substrates for growth. The sapphire substrates, however, are insulating substrates, and are not electrically conductive. Accordingly, forming two electrodes to sandwich a sapphire substrate is impossible. For this reason, to form a nitride semiconductor on a sapphire substrate, the epitaxial growth is followed, in general, by the etching of the substrate so as to expose the n type gallium nitride layer and by the formation of an n type contact on the etched surface. Thus formed is a structure in which two electrodes p type and of n type are on the same side of a surface.

However, in the configuration described above, that is, the configuration in which two electrodes of p type and n type are formed on the same surface, electric currents tend to concentrate on a mesa portion that is close to the n electrode. The concentration prevents the nitride semiconductor formed on a sapphire substrate from having a higher ESD (electrostatic discharge) voltage. In addition, uniform current injection into the active layer is difficult. This difficulty in turn brings about another difficulty in making the active layer emit light evenly. Moreover, the nitride semiconductor formed on a sapphire substrate needs wire-bonding electrodes, on the same surface, both for the p electrode and for the n electrode. On the other hand, in a nitride semiconductor formed on a conductive substrate, only a wire-bonding electrode for either one of the p electrode and the n electrode has to be formed on a single surface. Accordingly, the nitride semiconductor formed on a sapphire substrate has a narrower effective light-emitting area than the nitride semiconductor formed on a conductive substrate does.

A method used to solve the above-described problem involves removing the sapphire substrate so as to expose the n type gallium nitride layer, and forming an n electrode thereon. For example, there is a method known as the laser lift off (Laser Lift Off: hereafter, abbreviated as LLO) method. In this method, firstly, a compound crystal layer as a nitride semiconductor is formed on a GaN buffer layer that is formed on a sapphire substrate. Then, an excimer laser of, in general, not longer than 300 nm in wavelength, approximately, is irradiated at several hundreds mJ/cm$^2$ from the sapphire-substrate side. The GaN buffer layer is thus decomposed, and then the sapphire substrate is removed (see, for example, Patent Document 1). The chip formed in this method is identical to the chip formed using a GaN substrate. Accordingly, the electrodes can be formed on the opposite sides of the substrate.

Patent Document 1: JP-A-2003-168820
Patent Document 2: JP-A-2004-153271

DISCLOSURE OF THE INVENTION

Problems to be Solved by the Invention

Now, suppose a case where a p electrode and an n electrode are formed opposite to each other, and where light is extracted from the n electrode side, as in the case of the above-described conventional technique. A phenomenon which occurs in this case and which has been already known is that the critical angle of the interface between the n side GaN layer and the air is so small as to cause a decrease in the light extraction efficiency. A possible way to address this problem, that is, to increase the light extraction efficiency, is making use of the reflection of the surface of the p side electrode made of a metal. Even this use of the reflection has its own problems. An ohmic contact needs to be achieved between the p-side electrode and the p side GaN layer. Accordingly, the metal that can be used for the electrode is so limited that a metal with high reflectance cannot be used for the purpose.

There is a known configuration that aims to increase the intensity of light. In the configuration, Bragg reflection layers (high-reflectance layers) are formed both on the p side and on the n side so as to form a resonator structure, and light is extracted from the side of the p side electrode (see, for example, Patent Document 2). FIG. 5 shows this configuration. In FIG. 5, Bragg reflection layers (DBRs) each of which is made of a multilayer film are formed both on the p side and on the n side within the layers of a nitride semiconductor formed on a sapphire substrate so as to form a resonator cavity structure.

On top of a sapphire substrate 31, a GaN layer 32, an n-AlGaN/GaN DBR 33, an InGaN/GaN second active layer 34, an n-GaN layer 35, an InGaN/GaN first active layer 36, a p-AlGaN/GaN DBR 37, a p-GaN layer 38 are formed. The n side Bragg reflection layer 33 and the p side Bragg reflection layer 37 together form a resonator cavity structure. The Bragg reflection layer 33 and 37 increase the reflected-light intensity by making the phases of lights coming from the two interfaces strengthen each other. With this structure, more portion of the light irradiated from the active layers can be enclosed within the resonator cavity.

This resonator cavity structure produces highly directional light and makes beams thereof shaper, and thus, is suitable for a high-speed operation. This structure, however, is not suitable for a light emitting element for illumination, which needs to deliver light to a wide area. In addition, the sandwiching of the active layers with the high-reflectance layers lowers the light extraction efficiency.

The present invention is made to address the above-described problems and aims to provide a nitride semiconductor light emitting element that is capable of achieving higher light extraction efficiency and a wider irradiation angle of the outgoing light irrespective of the reflectance of the metal used for the electrodes.

Means for Solving the Problems

To achieve the above-mentioned object, an invention according to claim 1 provides a nitride semiconductor light emitting element provided at least with an n side electrode, an n type nitride semiconductor layer, a light emitting region, a p type nitride semiconductor layer, and a p side electrode, which are formed in this order. The provided nitride semiconductor light emitting element is characterized in that the n type nitride semiconductor layer is formed to be an anti-reflection layer, and that the p type nitride semiconductor layer is formed to be a Bragg reflection layer.

In addition, an invention according to claim 2 provides a nitride semiconductor light emitting element provided at least with an n side electrode, an n type nitride semiconductor layer, a light emitting region, a p type nitride semiconductor layer, and a p side electrode, which are formed in this order. The provided nitride semiconductor light emitting element is characterized in that the n type nitride semiconductor layer is formed to be a Bragg reflection layer, and that the p type nitride semiconductor layer is formed to be an anti-reflection layer.

In addition, an invention according to claim 3 provides the nitride semiconductor light emitting element according to claim 1. The provided nitride semiconductor light emitting element is characterized in that the anti-reflection layer is formed of a multilayer film with InGaN semiconductor layers and GaN semiconductor layers being alternately formed in this order from the side of the light emitting region, and that the Bragg reflection layer is formed of a multilayer film with AlGaN semiconductor layers and GaN semiconductor layers being alternately formed in this order from the side of the light emitting region.

In addition, an invention according to claim 4 provides the nitride semiconductor light emitting element according to claim 2. The provided nitride semiconductor light emitting element is characterized in that the anti-reflection layer is formed of a multilayer film with AlGaN semiconductor layers and GaN semiconductor layers being alternately formed in this order from the side of the light emitting region, and that the Bragg reflection layer is formed of a multilayer film with InGaN semiconductor layers and GaN semiconductor layers being alternately formed in this order from the side of the light emitting region.

In addition, an invention according to claim 5 provides the nitride semiconductor light emitting element according to claim 3. The provided nitride semiconductor light emitting element is characterized in that each of the InGaN semiconductor layers and of the GaN semiconductor layers is formed to have a film thickness of an odd integer multiple of a quarter of the wavelength $\lambda$ of the emitted light, and that each of the AlGaN semiconductor layers and of the GaN semiconductor layers is formed to have a film thickness of an integer multiple of a half of the wavelength $\lambda$ of the emitted light.

In addition, an invention according to claim 6 provides the nitride semiconductor light emitting element according to claim 4. The provided nitride semiconductor light emitting element is characterized in that each of the AlGaN semiconductor layers and of the GaN semiconductor layers is formed to have a film thickness of an odd integer multiple of a quarter of the wavelength $\lambda$ of the emitted light, and that each of the InGaN semiconductor layers and of the GaN semiconductor layers is formed to have a film thickness of an integer multiple of a half of the wavelength $\lambda$ of the emitted light.

Effects of the Invention

In the present invention, the use of n type nitride semiconductor layer as the anti-reflection layer is made to be accompanied by the use of p type nitride semiconductor layer as the Bragg reflection layer, or the use of n type nitride semiconductor layer as the Bragg reflection layer is made to be accompanied by the use of p type nitride semiconductor layer as the anti-reflection layer. Accordingly, higher light extraction efficiency can be achieved for the light extracted from any of the p side and n side irrespective of the types of metals used for the electrodes. In addition, the outgoing light can have a wider irradiation angle.

Figure 1:
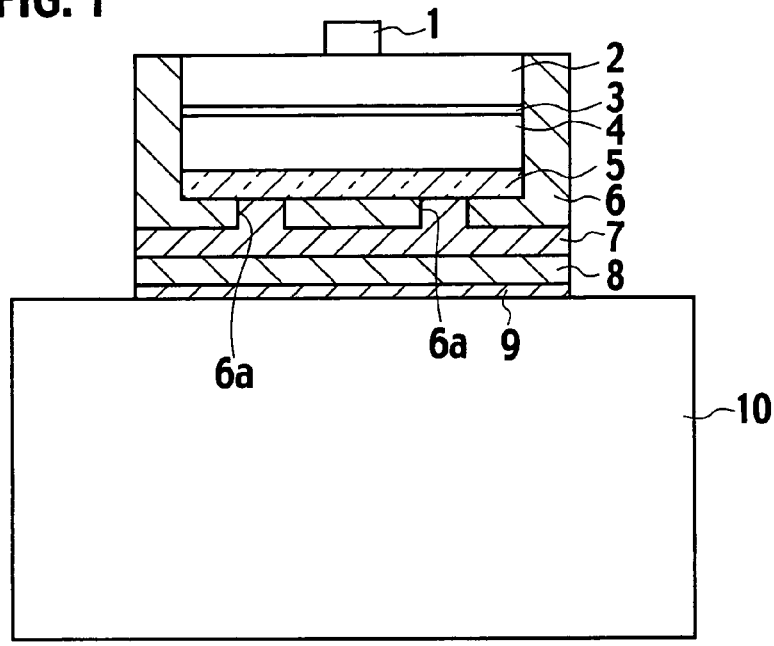
FIG. 1 is a diagram illustrating a sectional structure of a nitride semiconductor light emitting element according to the present invention.

DESCRIPTION OF SYMBOLS 1. n electrode
2. n side anti-reflection layer
3. MQW active layer
4. p side Bragg reflection layer
5. p electrode
6. insulating film
6a. contact hole
7. reflection film
8. pad electrode
9. conductive bonding layer
10. support substrate
21. GaN substrate
22. n side Bragg reflection layer
23. MQW active layer
24. p side anti-reflection layer
25. p electrode
26. n electrode

BEST MODES FOR CARRYING OUT THE INVENTION

An embodiment of the present invention will be described below with reference to the drawings. FIG. 1 illustrates a structure of a nitride semiconductor light emitting element according to the present invention.

The nitride semiconductor light emitting element has a double hetero structure in which an n side anti-reflection layer 2 and p side Bragg reflection layer 4 are formed so as to sandwich an MQW active layer 3 that serves as a light-emitting region. The MQW active layer 3 has a multiple quantum well structure formed with InGaN/GaN and the like. For example, a layered structure is formed with layers of $In_{0.17}GaN$ of a 30-Å thickness as the well layers and layers of undoped GaN of 100-Å thickness as barrier layers (blocking layers) that are alternated by eight cycles. Note that layers of InGaN with an In composition of a range from 0.5% to 2% may be used as the barrier layers.

An n type nitride contact layer is usually formed on an n type nitride semiconductor layer, but the n side anti-reflection layer 2 also serves as this n type nitride contact layer. In addition, a p type nitride contact layer is usually formed on a p type nitride semiconductor layer, but the p side Bragg reflection layer 4 also serves as this p type nitride contact layer.

Figure 2:
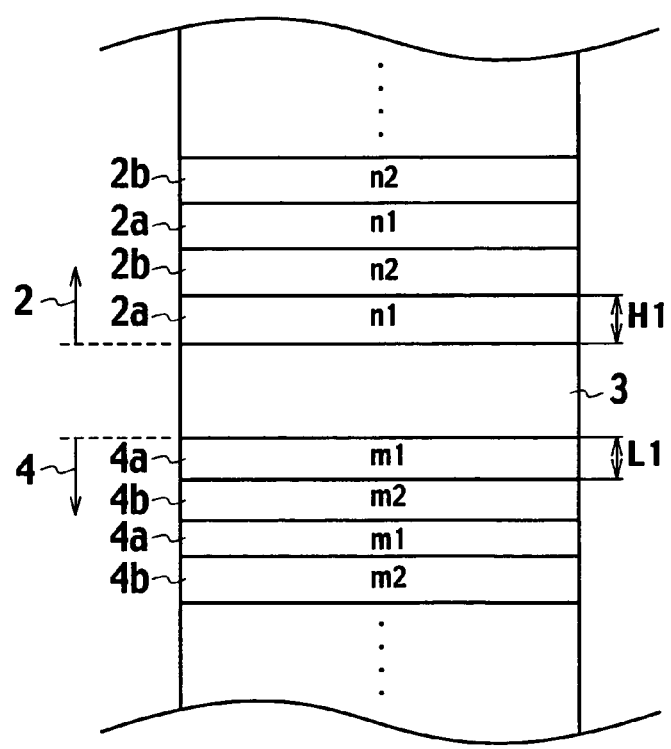
FIG. 2 is a diagram illustrating a layered structure of an n side anti-reflection layer and a p side Bragg reflection layer.

FIG. 2 illustrates, in detail, a layered structure of the n side anti-reflection layer 2 and the p side Bragg reflection layer 4. The n type anti-reflection layer 2 is formed to have a layered structure including InGaN layers 2a doped with n type impurities of Si and GaN layers 2b doped with n type impurities of Si.

Alternatively, a modulated doping is also allowable. Specifically, not both of the two kinds of layers—the InGaN layers 2a and GaN layers 2b—are doped with the n type impurities, but only either one of the two kinds of layers is doped with the impurities. In addition, the above-described layered structure is also a superlattice structure. While there is a big difference between the lattice constant of InGaN and that of GaN, the superlattice structure has an effect of reducing the stress between InGaN and GaN, and of, eventually, allowing easier growth of InGaN in the active layer.

The order of layers in the layered structure is as follows. Firstly, on top of the MQW active layer 3, one of the n-InGaN layers 2a is formed, and on top of that one of the n-InGaN layers 2a, one of the n-GaN layers 2b is formed. Then, the rest of the n-InGaN layers 2a and the rest of the n-GaN layers 2b are formed alternately. Finally, an n electrode 1 is formed so as to be in contact with one of the n-GaN layers 2b. Incidentally, an AlGaInN mixed crystal system has a larger refractive index as the In component becomes larger, so that the refractive index of an InGaN crystal is larger than that of a GaN crystal. Accordingly, if the refractive index of each of the n-InGaN layers 2a is represented by n1 and the refractive index of each of the n-GaN layers 2b is represented by n2, the relationship n1>n2 holds true.

In addition, the n side anti-reflection layer 2 is what is termed an AR coat (Anti-Reflective Coating) layer, and makes use of the interference phenomenon between basically plural reflected lights that are reflected off and coming from their respective interfaces. To be more specific, the intensity of the reflected light is reduced by shifting the phases of lights reflected off and coming from different interfaces by 180° so as to cancel out each other. For this reason, each of the n-InGaN layers 2a and of the n-GaN layers 2b is formed to have a film thickness H1 that is given by the following equation: $H1 = (1/4) \times \lambda \times N$ (N is an odd positive integer) where $\lambda$ represents the wavelength of the light emitted from the MQW active layer 3.

Among the lights traveling from one of the n-InGaN layers 2a to the corresponding one of the n-GaN layers, the light that enters perpendicularly to the boundary face has a reflectance R and a transmittance T respectively expressed as $R=\{(n1-n2)/(n1+n2)\}^2$, and $T=2 \times n1 \times n2/(n1+n2)^2$. Here, a larger n1 renders the transmittance T larger.

On the other hand, to serve as the p type nitride semiconductor layer, the p side Bragg reflection layer 4 is formed. The p side Bragg reflection layer 4 is formed to have a layered structure including AlGaN layers 4a doped with p type impurities of Mg and GaN layers 4b doped with p type impurities of Mg, and is formed to have a superlattice structure, as well.

The order of layers in the layered structure is as follows. Firstly, immediately below the MQW active layer 3, one of the p-AlGaN layers 4a is formed, and immediately below that one of the p-AlGaN layers 4a, one of the p-GaN layers 4b is formed. Then, the rest of the p-AlGaN layers 4a and the rest of the p-GaN layers 4b are formed alternately. Finally, a p electrode 5 is formed so as to be in contact with one of the p-GaN layers 4b. Incidentally, an AlGaInN mixed crystal system has a smaller refractive index as the Al component becomes larger, so that the refractive index of an AlGaN crystal is smaller than that of a GaN crystal. Accordingly, if the refractive index of each of the p-AlGaN layers 4a is represented by m1 and the refractive index of each of the p-GaN layers 4b is represented by m2, the relationship m2>m1 holds true.

In addition, the p side Bragg reflection layer 4, as in the case of the n side anti-reflection layer 2, makes use of the interference phenomenon between basically plural reflected lights that are reflected off and coming from their respective interfaces. To be more specific, the intensity of the reflected light is increased by shifting the phases of lights reflected off and coming from different interfaces by 360° so as to enhance each other. For this reason, each of the p-AlGaN layers 4a and of p-GaN layers 4b is formed to have a film thickness L1 that is given by the following equation: $L1 = (1/2) \times \lambda \times M$ (M is a positive integer) where $\lambda$ represents the wavelength of the light emitted from the MQW active layer 3.

The n electrode 1 is formed on the top surface of the n side anti-reflection layer 2. The n electrode 1 is made either of a multilayer body of Ti and Al or of Al, for example. An ohmic contact is achieved between the n electrode 1 and the n side anti-reflection layer 2. On the other hand, the p electrode 5 may be made of a Pd/Au metal multilayer film. Alternatively, the p electrode 5 may be made as a transparent electrode. In this case, for example, the p electrode 5 is formed as an electrode that achieves an ohmic contact by use of ZnO doped with Ga. In the case where the p electrode is made of ZnO doped with Ga, which has a lattice constant that is approximately equal to that of GaN, a favorable ohmic contact can be formed between the p electrode 5 and one of the p-GaN layers 4b within the p side Bragg reflection layer 4 without an annealing process that would otherwise be performed later.

A reflection film 7 is formed to reflect the light that comes out to the side of the p electrode 5 and to redirect the light towards the n electrode 1. The redirected light is to be extracted. Note that the p side Bragg reflection layer 4 is formed on the p side. Accordingly, most of the light emitted from the MQW active layer 3 is reflected and redirected towards the side of the n electrode 1, but it is not unrealistic to assume that 100% part of the light emitted from the MQW active layer 3 is reflected off the p side Bragg reflection layer 4. The reflection film 7 is therefore formed to reflect and make effective use of even the smallest part of the light that is allowed to pass through the Bragg reflection layer 4. A silver-white metal, such as Al and Ag, which can serve as a reflector mirror, is used as the material for the reflection film 7.

An insulating film 6 is formed in a ring shape on the edges of the chip. In the case of a semiconductor laser, the insulating film 6 is formed in the two side surfaces of the chip so as to obtain a resonator structure. SiN, SOG (Spin On Glass), or the like is used as a material for the insulating layer 6.

One thing that should be noted here is that the reflection film 7 is not bonded directly to the entire part of a surface of the p electrode 5. Instead, the reflection film 7 is formed so that parts of the reflection film 7 can be in direct contact with the p electrode 5 through small contact holes 6a. For the rest of the area, the reflection film 7 is formed so that the insulating film 6 can be located between the part of the reflection film 7 and the corresponding part of the p electrode 5. The reason for such a way of forming the reflection film 7 is that, in a case where the p electrode 5 is a transparent electrode, making almost entire part of a surface of the p electrode 5 be in contact with the reflection film 7 causes absorption of light that takes place between the p electrode 5 and the reflection film 7. Such light absorption results in a decrease in reflectance. Accordingly, by making the p electrode 5 be in contact with the reflection film 7 only through the contact holes 6a, as in the case of FIG. 1, the light absorption takes place only in the portion corresponding to the contact holes 6a, and the reflectance can be kept high.

A pad electrode 8 made of Au or the like is formed on the p side. The p electrode 5, the reflection film 7, and the pad electrode 8 are electrically connected to one another. A conductive bonding layer 9 is formed to bond the pad electrode 8 and a support substrate 10 together. The conductive bonding layer 9 may be made of a brazing filler metal, such as solder. In the case of thermocompression bonding, the conductive bonding layer 9 may be made of a multi-layer metal film of Ti and Au, Au alone, a multi-layer metal film of Ti and an alloy of Au and Sn, or the like. The conductive bonding layer 9 electrically connects the pad electrode 8 to the support substrate 10.

The support substrate 1 is made of a conductive substrate with an excellent heat-radiation performance. As a conductive substrate, materials such as GaN, silicon, SiC may be used. Alternatively, Cu or the like may be used as a material for a highly thermal conductive sub mount.

The nitride semiconductor light emitting element shown in FIG. 1 is formed in a way to be described below. The outline of its manufacturing processes is as follows. Firstly, a multi-layer semiconductor body of nitride is formed on top of a substrate for growth. Then, the multilayer semiconductor body is bonded to a support substrate, and, after that, the substrate for growth is removed either by LLO or by polishing. Then, an n electrode is formed to complete the formation of the nitride semiconductor light emitting element.

To begin with, a sapphire substrate is used as the substrate for growth, and the sapphire substrate is put in an MOCVD apparatus. The sapphire substrate is thermally cleaned by flowing hydrogen gas and by raising the temperature up to approximately 1050° C. Then the temperature is lowered down to approximately 600° C., and a GaN buffer layer (not illustrated) is grown. Then, the temperature is raised again up to approximately 1000° C., and layers including the n side anti-reflection layer 2 and the MQW active layer 3 are formed. After that, the temperature is raised furthermore, and a layer of the p side Bragg reflection layer 4 is formed.

In a case where the p electrode 5 is formed as a transparent electrode, a layer of an electrode of ZnO doped with Ga is formed by the molecular beam epitaxy method, and the electrode thus formed has resistivity of approximately $2e^{-4}$ Ωcm. Then a mask is formed with a resist or a dielectric film such as one made of $SiO_2$, and mesa etching is carried out by the ICP method or the like so as to form a chip shape. Here the mesa etching is carried out so as to etch through the MQW active layer 3 until the GaN buffer layer is exposed. Then, the etching is stopped.

After that, the insulating film 6 is roughly formed by the P-CVD method or the sputtering method. Then, the contact holes 6a that reach the ZnO electrode is formed by the CF4 dry etching method. The CF4 dry etching has a slow etching rate for ZnO, so that the ZnO electrode itself functions as an etching stop. Once the contact holes 6a have been formed, the reflection film 7 is formed firstly, and then the pad electrode 8 and the conductive bonding layer 9 are formed successively.

After that, the etching that has been stopped is resumed under the similar conditions to those in the above-described first etching. The etching of this time continues until the sapphire substrate is exposed. Then the support substrate is brought in and the wafer is bonded to the top surface of the support substrate 1 by thermocompression bonding or the like using the conductive bonding layer 9.

After that, a KrF laser oscillating at 248 nm is applied from the sapphire substrate side towards the GaN buffer layer. In the case of a KrF laser, the necessary irradiation energy is in a range from 300 mJ/cm$^2$ to 400 mJ/cm$^2$. Almost all of the 248-nm light is allowed to pass through the sapphire, but GaN absorbs almost 100% part of the light. Consequently, the temperature rapidly rises at the sapphire/GaN interface, and the GaN is decomposed so as to allow the removal of the sapphire substrate. After the removal of the sapphire substrate, the residual Ga is eliminated by an acid etching technique or the like, and the n electrode 1 is formed. In this way, the formation of the nitride semiconductor light emitting element shown in FIG. 1 is completed.

Figure 3:
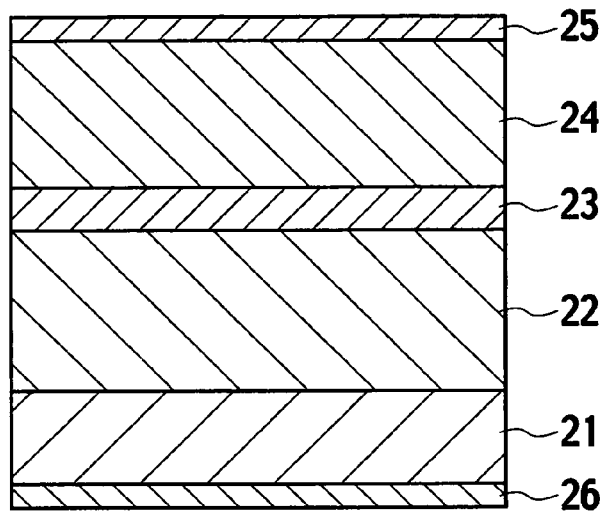
FIG. 3 is a diagram illustrating another sectional structure of a nitride semiconductor light emitting element according to the present invention.

FIG. 3 illustrates a configuration of a nitride semiconductor light emitting element that extracts the light from the p side. To form the nitride semiconductor light emitting element shown in FIG. 3, on top of a conductive GaN substrate 21, a n side Bragg reflection layer 22, an MQW active layer 23, a p side anti-reflection layer 24, and a p electrode 25 are formed in this order. Lastly, the p electrode 25 and an n electrode 26 are formed by a vapor deposition method or by sputtering.

An n type nitride contact layer and a p type nitride contact layer are usually formed so as to sandwich the MQW active layer 23. In the nitride semiconductor light emitting element shown in FIG. 3, however, the n side Bragg reflection layer 22 also serves as this n type nitride contact layer. In addition, the p side anti-reflection layer 24 also serves as the p type nitride contact layer.

Figure 4:
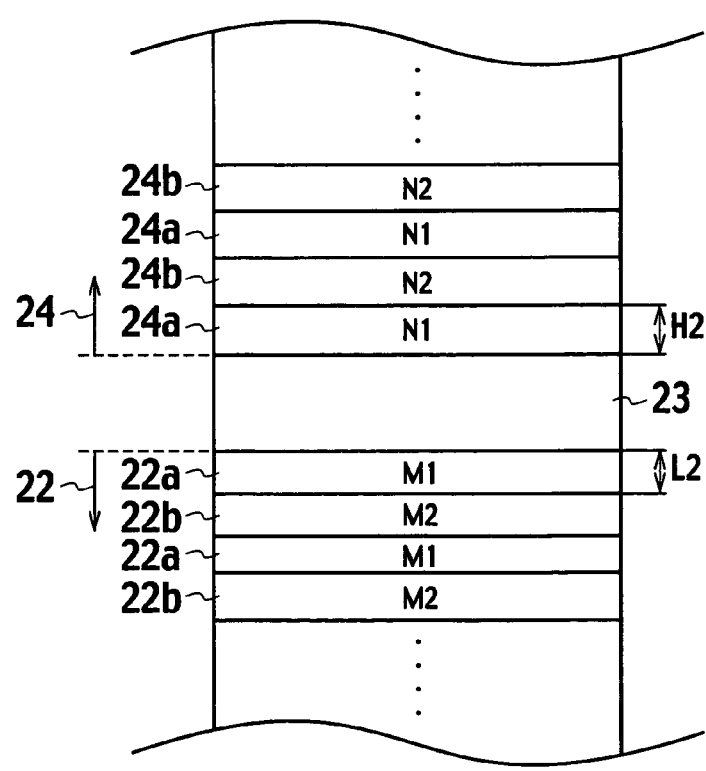
FIG. 4 is a diagram illustrating another layered structure of an n side Bragg reflection layer and a p side anti-reflection layer.
Figure 5:
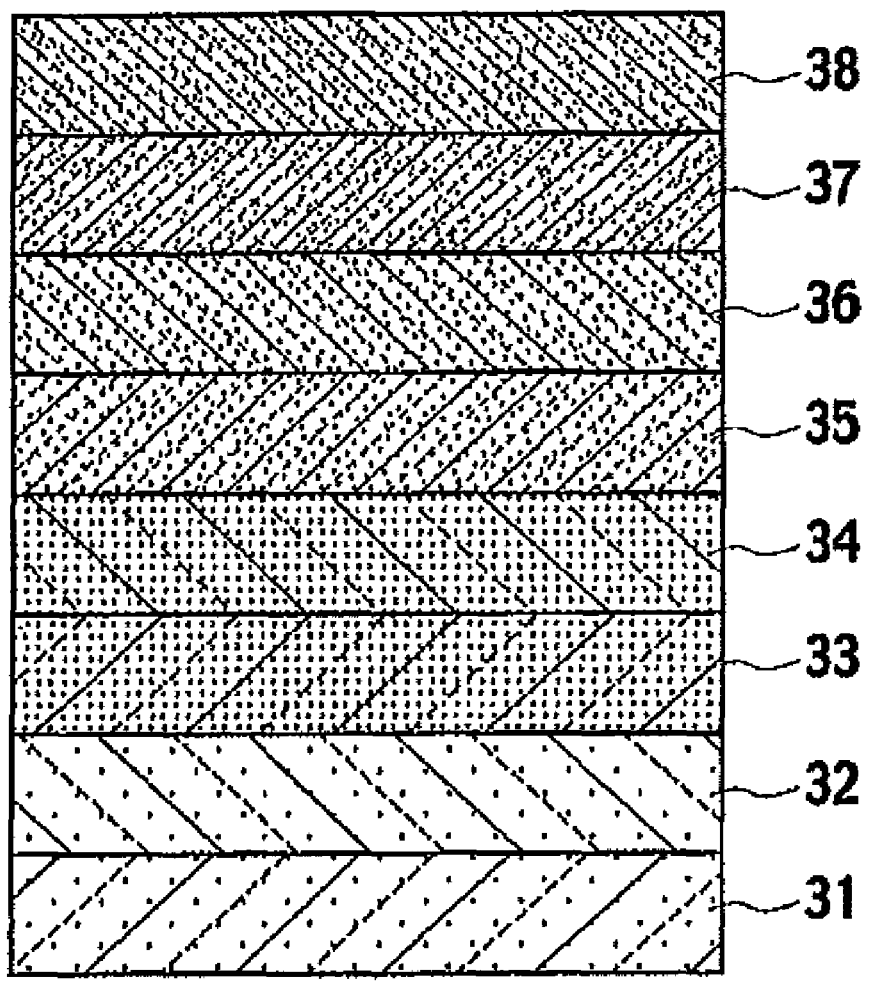
FIG. 5 is a diagram illustrating a configuration example of a conventional-type nitride semiconductor light emitting element.

FIG. 4 illustrates, in detail, a layered structure of the p side anti-reflection layer 24 and the n side Bragg reflection layer 22. The n-side Bragg reflection layer 22 is formed to have a layered structure including InGaN layers 22a doped with n type impurities of Si and GaN layers 22b doped with n type impurities of Si. Alternatively, a modulated doping is also allowable. Specifically, not both of the two kinds of layers—the InGaN layers 2a and GaN layers 2b—are doped with the n type impurities, but only either one of the two kinds of layers is doped with the impurities. In addition, as in the case of FIG. 2, the n side Bragg reflection layer 22 also has a superlattice structure. While there is a big difference between the lattice constant of InGaN and that of GaN, the superlattice structure has an effect of reducing the stress between InGaN and GaN, and of, eventually, allowing easier growth of InGaN in the active layer.

The MQW active layer 23 that serves as a light-emitting region has a multiple quantum well structure in which InGaN well layers and either GaN or InGaN barrier layers are alternately formed. Examples for the compositions of each layer and the number of cycles by which sets of two kinds of layers are formed are the same as their respective examples given in the case of FIG. 1. The n electrode 1 functions also to reflect the light that is allowed to pass through the n side Bragg reflection layer 22. The n electrode 1 is made either of a multilayer body of Ti and Al or of Al, for example. An ohmic contact is achieved between the n electrode 1 and the n side Bragg reflection layer 22. In addition, to extract the light from the side of the p electrode 5, the p electrode is formed to be a transparent electrode. An electrode of ZnO doped with Ga and an ITO electrode are some of the examples of the p electrode 5.

The order of layers in the n side Bragg reflection layer 22 is similar to the order in the n side anti-reflection layer 2 shown in FIG. 2. Here, if the refractive index of each of the n-InGaN layers 22a is represented by M1 and the refractive index of each of the n-GaN layers 22b is represented by M2, the relationship M1>M2 holds true. The n side Bragg reflection layer 22, however, differs from the n side anti-reflection layer 2 in the following point. The n side Bragg reflection layer 22 is configured to increase the intensity of the reflected light by shifting the phases of lights reflected off and coming from different interfaces by 360° so as to enhance each other. For this reason, each of the n-InGaN layers 22a and of n-GaN layers 22b is formed to have a film thickness L2 that is given by the following equation: $L2=(1/2)\times\lambda\times K$ (K is a positive integer) where $\lambda$ represents the wavelength of the light emitted from the MQW active layer 23.

In addition, the n side anti-reflection layer 24 is what is termed an AR coat (Anti-Reflective Coating) layer. The order of layers in n side anti-reflection layer 24 is similar to the order in the p side Bragg reflection layer 4 shown in FIG. 2. Here, if the refractive index of each of the p-AlGaN layers 24a is represented by N1 and the refractive index of each of the p-GaN layers 24b is represented by N2, the relationship N2>N1 holds true. The p side anti-reflection layer 24, however, differs from the p side Bragg reflection layer 4 in the following point. The p side anti-reflection layer 24 is configured to decrease the intensity of the reflected light by shifting the phases of lights reflected off and coming from different interfaces by 180° so as to cancel out each other. For this reason, each of the p-AlGaN layers 24a and of p-GaN layers 24b is formed to have a film thickness H2 that is given by the following equation: $H2=(1/4)\times\lambda\times K$ (K is an odd positive integer) where $\lambda$ represents the wavelength of the light emitted from the MQW active layer 23.

As has been described thus far, an anti-reflection layer (AR coat layer) made of a multilayer film is disposed at the light-extracting-direction side of the light emitting region, and a Bragg reflection layer is disposed at the opposite side of the light emitting region to the light-extracting-direction side. Accordingly, among the lights emitted from the light emitting region, the light advancing in the light-extracting direction suffers from a reduced influence of reflection. On the other hand, the light advancing in the opposite direction to the light-extracting direction is reflected off the Bragg reflection layer and redirected in the light-extracting direction, so that the light extraction efficiency can be improved.

The invention claimed is:

1. A nitride semiconductor light emitting element, comprising:
a p side electrode;
a p type nitride semiconductor layer disposed on the p side electrode;
a light emitting region disposed on the p type nitride semiconductor layer;
an n type nitride semiconductor layer disposed on the light emitting region; and
an n side electrode disposed on the n type nitride semiconductor layer, wherein
the n type nitride semiconductor layer is disposed on a light extraction side of the light emitting region and the p type nitride semiconductor layer is disposed on a side opposite to the light extraction side of the light emitting region,
the n type nitride semiconductor layer is formed to be an anti-reflection layer which is formed of a first multilayer film comprised of alternating n-InGaN semiconductor layers and n-GaN semiconductor layers, the layer of the first multilayer film closest to the light emitting region being an n-InGaN semiconductor layer and the layer of the first multilayer film furthest from the light emitting region being an n-GaN semiconductor layer, and
the p type nitride semiconductor layer is formed to be a Bragg reflection layer which is formed of a second multilayer film comprised of alternating p-AlGaN semiconductor layers and p-GaN semiconductor layers, the layer of the second multilayer film closest to the light emitting region being a p-AlGaN semiconductor layer and the layer of the second multilayer film furthest to the light emitting region being a p-GaN semiconductor layer.

2. The nitride semiconductor light emitting element according to claim 1, wherein
each of the n-InGaN semiconductor layers and the n-GaN semiconductor layers is formed to have a film thickness of an odd integer multiple of a quarter of the wavelength $\lambda$ of the emitted light in that layer, and
each of the p-AlGaN semiconductor layers and the p-GaN semiconductor layers is formed to have a film thickness of an integer multiple of a half of the wavelength $\lambda$ of the emitted light in that layer.

3. The nitride semiconductor light emitting element according to claim 1, wherein
the n side electrode is in contact with an n-GaN layer of the anti-reflection layer, and
the p side electrode is in contact with a p-GaN layer of the Bragg reflection layer.

* * * * *